United States Patent [19]
Kling et al.

[11] Patent Number: 4,467,323
[45] Date of Patent: Aug. 21, 1984

[54] ENGINE ANALYZER WITH SIMULATED ANALOG METER DISPLAY

[75] Inventors: Michael J. Kling, Mequon; Joseph A. Marino, Waukesha, both of Wis.

[73] Assignee: Bear Automotive Service Equipment Company, Milwaukee, Wis.

[21] Appl. No.: 327,732

[22] Filed: Dec. 4, 1981

[51] Int. Cl.³ .............................................. G09G 1/00
[52] U.S. Cl. ................................... 340/721; 340/720; 340/722; 364/551
[58] Field of Search ............... 364/550, 551; 73/117.3; 324/115, 96, 379, 384; 340/715, 721, 722, 727, 734, 745, 706, 753, 754, 720

[56] References Cited
U.S. PATENT DOCUMENTS

| | | | |
|---|---|---|---|
| 3,726,250 | 4/1973 | Merk | 340/753 |
| 3,908,355 | 9/1975 | Wiesner | 340/753 |
| 4,376,934 | 3/1983 | Prohaska et al. | 340/815.17 |

Primary Examiner—Errol A. Krass
Assistant Examiner—Clifford L. Tager
Attorney, Agent, or Firm—Kinney & Lange

[57] ABSTRACT

An engine analyzer for an internal combustion engine includes circuitry, under the control of a microprocessor, which senses parameters of operation of the internal combustion engine and supplies digital signals indicative of those sensed parameters. A raster scan cathode ray tube (CRT) display is controlled by the microprocessor to display a simulation of an analog meter having a pointer or needle which moves as a function of the digital signals. When an analog display, such as a tachometer, is selected, the microprocessor controls the raster scan CRT to display a visual depiction of a meter having the appropriate range of values and having a needle which moves according to the measurements made by the system. The microprocessor automatically changes the scale of the simulated meter as appropriate without operator intervention. When operation within a predetermined range of values is required, the microprocessor causes the raster scan CRT display to produce a shaded area representing the range within which the needle should remain.

25 Claims, 7 Drawing Figures

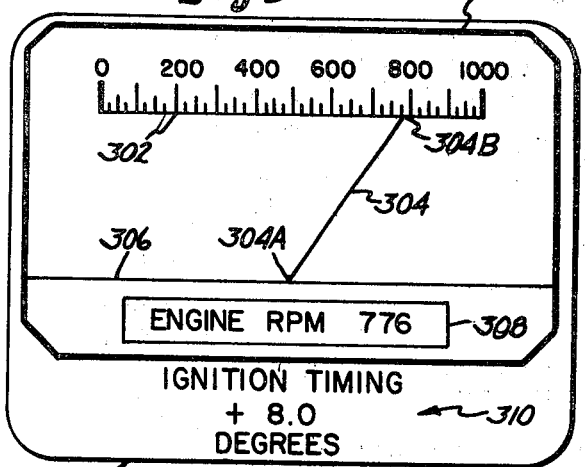
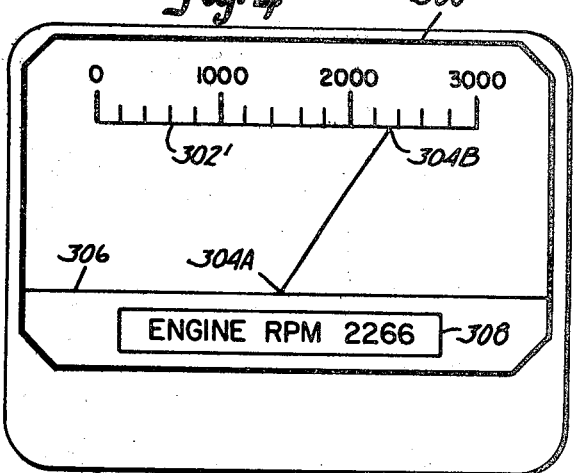
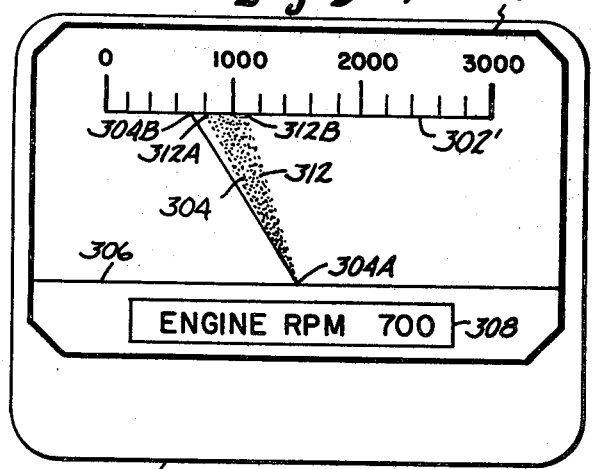
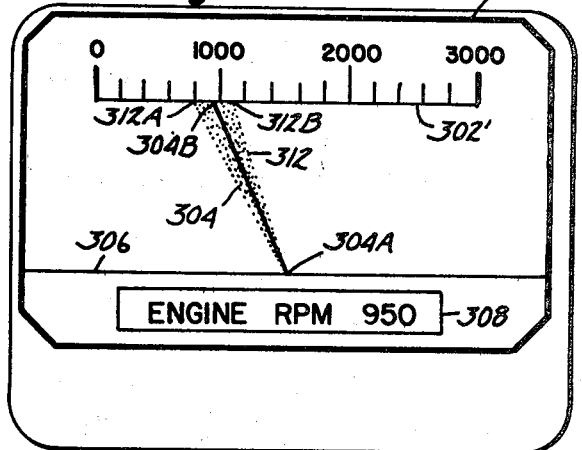
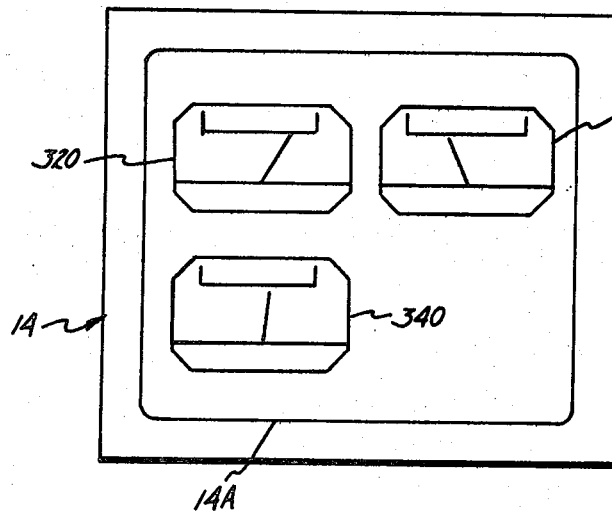

ENGINE ANALYZER WITH SIMULATED ANALOG METER DISPLAY

CROSS-REFERENCE TO RELATED APPLICATIONS

Reference is hereby made to the following copending applications, which were filed on even date with the present application and are assigned to the same assignee as the present application: ENGINE ANALYZER WITH DIGITAL WAVEFORM DISPLAY, J. Marino, M. Kling and S. Roth Ser. No. 327,734; ENGINE ANALYZER WITH CONSTANT WIDTH DIGITAL WAVEFORM DISPLAY, J. Marino, and M. Kling Ser. No. 327,511, and now U.S. Pat. No. 4,399,407; and IGNITION COIL TEST APPARATUS, J. Marino, M. Kling, S. Roth and S. Makhija Ser. No. 327,733.

BACKGROUND OF THE INVENTION

1. Field of the Invention

The present invention relates to engine analyzer apparatus used for testing internal combustion engines.

2. Description of the Prior Art

One common type of engine analyzer apparatus used for testing an internal combustion engine employs a cathode ray tube having a display screen on which analog waveforms are displayed which are associated with operation of the engine. In a typical apparatus of this type, a substantially horizontal trace is produced on the screen of the cathode ray tube by applying a sawtooth ramp voltage between the horizontal deflection plates of the tube while the analog signal being measured is applied to the vertical deflection plates of the tube. The typical analog signals which are applied to the vertical plates of the cathode ray tube are the primary voltage which exists across the primary winding of the ignition coil, and a signal representative of the secondary voltage of the ignition coil. These voltages are affected by the condition of various elements of the ignition system of the engine, such as the spark plugs.

With the advent of low cost microelectronic devices, and in particular microprocessors, digital electronic systems have found increasing use in a wide variety of applications. Digital electronic systems have many significant advantages over analog systems, including increased ability to analyze and store data, higher accuracy, greater flexibility in design and application, and the ability to interface with computers having larger and more sophisticated data processing and storage capabilities. In the past, some engine analyzer systems have been proposed which utilize microprocessors and digital circuitry to control some of the functions of the engine analyzer apparatus. In these prior art systems, however, the waveform display function of the engine analyzer apparatus has remained essentially an analog electrical function, even when the systems utilize microprocessors and digital electronics for other functions.

Engine analyzers also typically include a number of analog panel meters wich are used to display other operating parameters which are measured by the engine analyzer. One example of an analog panel meter used in the prior art engine analyzers is a tachometer. Even in the engine analyzer systems using microprocessors and digital circuitry, analog panel meters have continued to be used. For example, an analog display of engine rpm is far more meaningful than a digital display, since engine speed varies continuously. In addition, in certain tests it is necessary for the operator to find an rpm peak or valley while making an adjustment to the engine. This is far easier for the operator to visualize when displayed in analog rather than digital form.

The use of analog panel meters, however, has several important disadvantages. First, the accuracy of low cost analog panel meters is not very good. Higher accuracy can be achieved with more expensive panel meters, but this increases the overall cost of the engine analyzer apparatus. Second, analog panel meters typically must be dedicated to a particular function. As a result, versatility of the meter is sacrificed, and cost is increased since a different meter must be provided for each of several different measurements which will be taken. Third, it is difficult to indicate different ranges on an analog meter. When the measured value is outside of the range of the meter, the operator must manually change the range by a selector switch, and then must decide which scale on the meter is to be used when viewing the meter.

SUMMARY OF THE INVENTION

The present invention is an improved engine analyzer apparatus for an internal combustion engine in which signals representing operation of the engine are displayed in the form of a simulated analog meter display. In the apparatus of the present invention, analog input signals are digitized. Digital control means, which preferably includes a programmed digital computer such as a microprocessor, controls a point addressable digital display.

The digital control means causes the point addressable display to display a visual depiction of an analog display, including a scale and a pointer. Based upon the scale and the value of the digitized input signal, the digitakl control means causes the point addressable display to display the pointer so that the pointer has its end point directed to a point on the scale corresponding to the value of the digitized input signal. The digital control means updates the point addressable display at a rate which is high enough so that the pointer appears to move as the measured input signal varies so as to simulate movement of a pointer of an analog panel meter.

In preferred embodiments of the present invention, the digital control means automatically selects the displayed scale of the meter as a function of the digitized input signal. As a result, as the value of the digitized input signal varies, the digital control means automatically adjusts the scale of the displayed simulated meter so that the pointer remains within the displayed scale.

In certain applications, the measured value must be maintained within a predetermined range. In these cases, the digital control means of the apparatus of the present invention preferably causes the point addressable display to further display a shaded area representing the range within which the pointer should be maintained. The digital control means causes the point addressable display to display data in two different "planes" which overlie one another, but which are independent so that the pointer can move within the shaded area.

BRIEF DESCRIPTION OF THE DRAWINGS

FIG. 3 shows a cathode ray tube (CRT) display of the engine analyzer apparatus of the present invention displaying a simulated analog tachometer.

FIG. 4 shows the CRT display of FIG. 3 displaying the simulated analog tachometer with a different scale from that shown in FIG. 3.

FIGS. 5A and 5B show the CRT display displaying a simulated analog tachometer with a simulated movable pointer and a stationary shaded range of desired operation.

FIG. 6 shows the CRT display displaying multiple simulated analog meters simultaneously on the same screen.

DETAILED DESCRIPTION OF THE PREFERRED EMBODIMENTS

Figure 1:
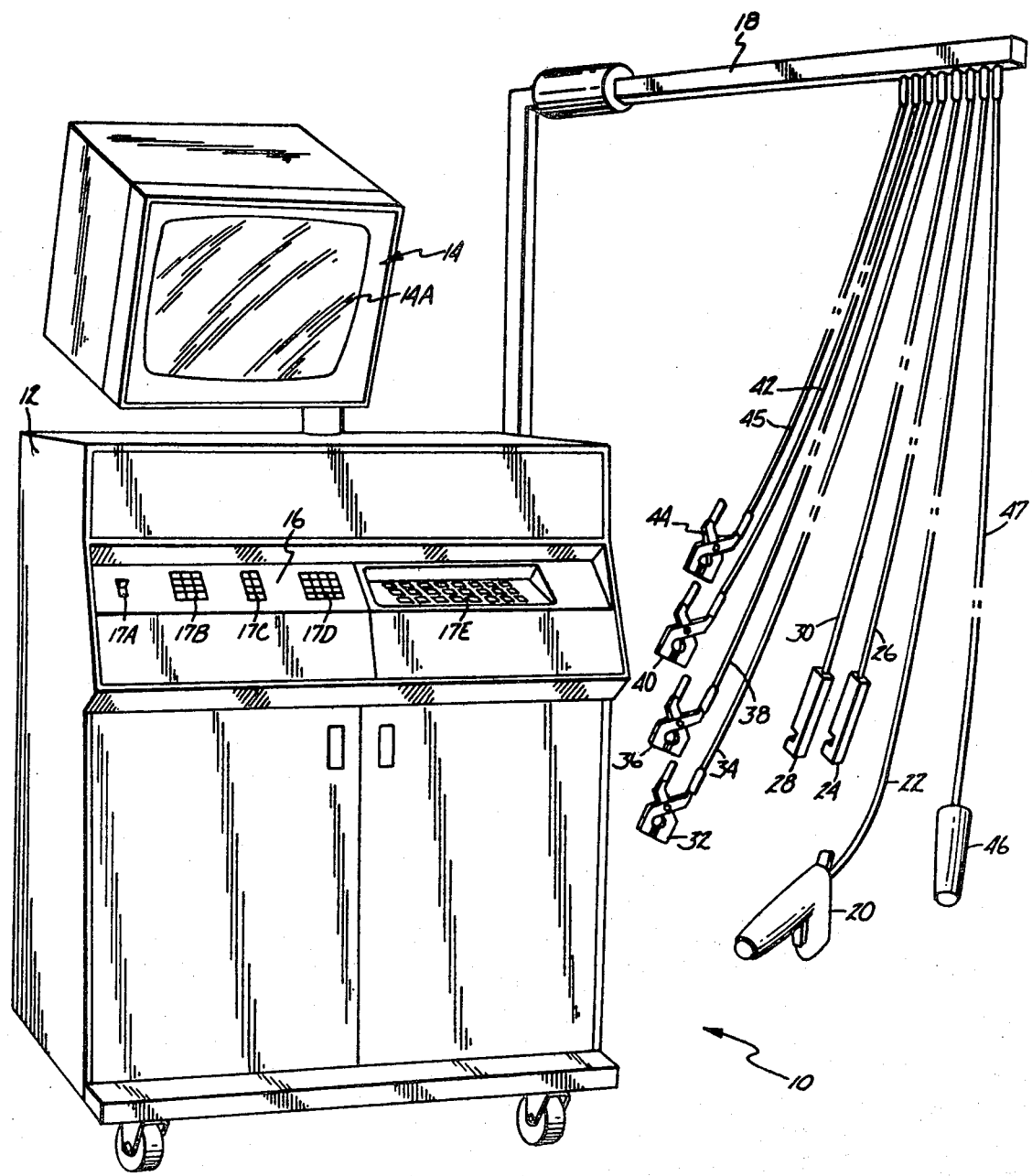
FIG. 1 is a perspective view showing an engine analyzer apparatus which utilizes the present invention.

In FIG. 1, engine analyzer 10 is shown. Mounted at the front of housing 12 of analyzer 10 are point-addressable cathode ray tube (CRT) raster scan display 14 and user interface 16, which is preferably a control panel having a plurality of control switches 17A–17D, as well as a keyboard 17E for entering numerical information. Extending from boom 18 are a plurality of cables which are electrically connected to the circuitry within housing 12, and which are intended for use during operation of the analyzer 10. Timing light 20 is connected at the end of multiconductor cable 22. "High tension" (HT) probe 24 is connected at the end of multiconductor cable 26, and is used for sensing secondary voltage of the ignition system of an internal combustion engine of a vehicle (not shown). "No. 1" probe 28 is connected to the end of multiconductor cable 30, and is used to sense the electrical signal being supplied to the No. 1 sparkplug of the ignition system. "Engine Ground" connector 32, which is preferably an alligator-type clamp, is connected at the end of cable 34, and is typically connected to the ground terminal of the battery of the ignition system. "Points" connector 36, which is preferably an alligator-type clamp, is attached to the end of cable 38 and is intended to be connected to one of the primary winding terminals of an ignition coil of the ignition system. "Coil" connector 40, which is preferably an alligator-type clamp attached to the end of cable 42, is intended to be connected to the other primary winding terminal of the ignition coil. "Battery" connector 44, which is preferably an alligator-type clamp, is attached to the end of cable 45. Battery connector 44 is connected to the "hot" or "non-ground" terminal of the battery of the ignition system. Vacuum transducer 46 at the end of multiconductor cable 47 produces an electrical signal which is a linear function of vacuum or pressure, such as intake manifold vacuum or pressure.

In the present invention, electrical signals derived from probes 24 and 28, from connectors 32, 36, 40 and 44, and from vacuum transducer 46 are used to produce digital signals which are stored as digital data in digital memory. Upon request by the user through user interface 16, analyzer 10 of the present invention displays on display 14 waveforms derived from selected stored digital data or simulated analog meters, such as a tachometer, or alpha-numerical messages or information.

Figure 2:
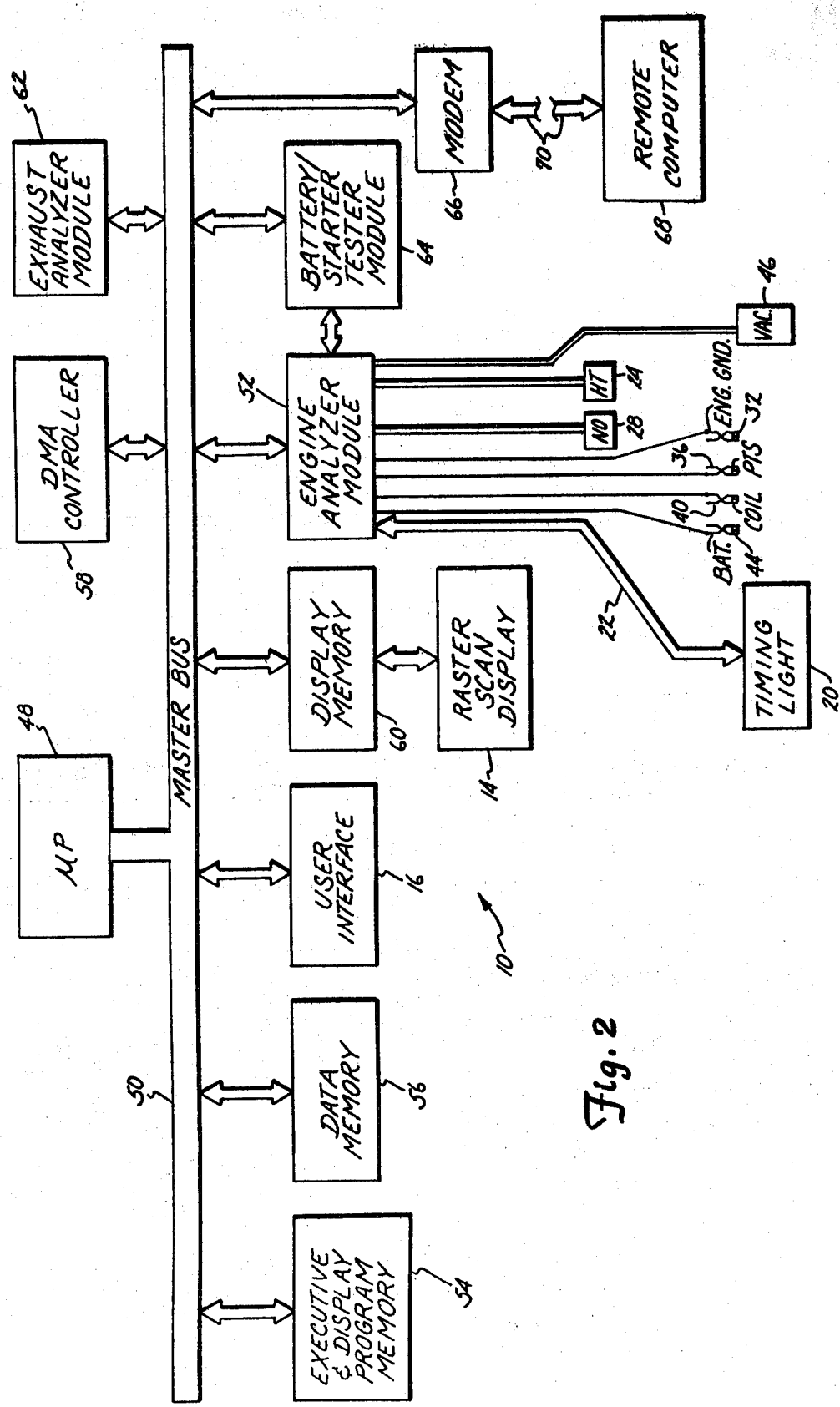
FIG. 2 is an electrical block diagram of the engine analyzer apparatus of FIG. 1.

FIG. 2 is an electrical block diagram showing engine analyzer 10 of the present invention. Operation of engine analyzer 10 is controlled by microprocessor 48, which communicates with the various subsystems of engine analyzer 10 by means of master bus 50. In the preferred embodiments of the present invention, master bus 50 is made up of fifty-six lines which form a data bus, an address bus, a control bus, and a power bus.

Timing light 20, HT probe 24, No. 1 probe 28, Engine Ground connector 32, Points connector 36, Coil connector 40, Battery connector 44, and vacuum transducer 46 interface with the electrical system of engine analyzer 10 through engine analyzer module 52. As described in further detail in the previously mentioned copending applications, which are incorporated herein by reference, engine analyzer module 52 includes a digital section and an analog section. Input signal processing is performed in the analog section, and the input analog signals received are converted to digital data. The digital section of engine analyzer module 52 interfaces with master bus 50.

Control of the engine analyzer system 10 by microprocessor 48 is based upon a stored program in engine analyzer module 52 and a stored program in executive and display program memory 54 (which interfaces with master bus 50). Digitized waveforms and signals produced, for example, by engine analyzer module 52 are stored in data memory 56. The transfer of digitized waveforms and signals from engine analyzer module 52 to data memory 56 is provided by direct memory access (DMA) controller 58. When engine analyzer module 52 provides a DMA Request signal on master bus 50, DMA controller 58 takes control of master bus 50 and transfers the digitized data from engine analyzer module 52 directly to data memory 56. As soon as the data has been transferred, DMA controller 58 permits microprocessor 48 to again take control of master bus 50. As a result, the system shown in FIG. 2 achieves storage of digitized waveforms and signals in data memory 56 without requiring an inordinate amount of time of microprocessor 48 to accomplish the data transfer.

User interface 16 interfaces with master bus 50 and preferably includes keyboard 17E through which the operator can enter data and switches 17A–17D through which the operator can select particular tests or particular waveforms or meters to be displayed. When the operator selects a particular waveform by means of user interface 16, microprocessor 48 retrieves the stored digitized waveform from data memory 56, converts the digitized waveform into the necessary digital display data to reproduce the waveform on raster scan display 14, and transfers that digital display data to display memory 60. As long as the digital display data is retained by display memory 60, raster scan display 14 continues to display the same waveform.

Display memory 60 contains one bit for each picture element (pixel) that can be displayed on raster scan display 14. Each bit corresponds to a dot on screen 14A of raster scan display 14. The digitized waveform stored in data memory 56 preferably represents individual sampled points on the waveform. Executive and display program memory 54 includes a stored display program which permits microprocessor 48 to "connect the dots" represented by the individual sampled points of the digitized waveform, so that the waveform displayed by raster scan display 14 is a reconstructed waveform which has the appearance of a continuous analog waveform, rather than simply a series of individual dots. Microprocessor 48 determines the coordinates of the dot representing one digitized sampled point on the digitized waveform, determines the coordinates of the next dot, and then fills in the space between the two dots with additional intermediate dots to give the appearance of a continuous waveform. The digital display data stored in display memory 60, therefore, includes bits corresponding to the individual sampled points on the waveform which had been stored by data memory 56, plus bits corresponding to the intermediate dots between these individual sampled points.

As further illustrated in FIG. 2, engine analyzer 10 has the capability of expansion to perform other engine test functions by adding other test modules. These modules can include, for example, exhaust analyzer module 62 and battery/starter tester module 64. Both modules 62 and 64 interface with the remaining system of analyzer 10 through master bus 50 and provide digital data or digitized waveforms based upon the particular tests performed by those modules. In the preferred embodiments shown in FIG. 2, modulator/demodulator (MODEM) 66 also interfaces with master bus 50, to permit analyzer 10 to interface with remote computer 68 through communication link 70. This is a particularly advantageous feature, since remote computer 68 typically has greater data storage and computational capabilities that are present within analyzer 10. Modem 66 permits digitized waveforms stored in data memory 56 to be transferred to remote computer 68 for further analysis, and also provides remote computer 68 to provide test parameters and other control information to microprocessor 48 for use in testing.

In certain tests and operations of engine analyzer 10, an analog panel meter is more suitable than a digital display. One example is that of a tachometer. Certain adjustments to be made by an operator or technician require that the operator find an rpm peak or valley as he makes the adjustment. Since engine rpm varies continuously as an engine runs, reading a digital readout would be extremely inconvenient and difficult for the operator.

The use of an analog panel meter tachometer, however, has disadvantages. The accuracy of low cost panel meters is not very good. In addition, versatility of the engine analyzer is sacrificed by requiring specialized dedicated meters for particular functions. It is also difficult to indicate different rpm ranges on an analog tachometer, and the operator must often change ranges in order to keep the meter needle within the range of the analog meter. This is inconvenient, particularly when tests are being performed.

The present invention overcomes these inherent disadvantages of analog panel meters by utilizing point addressable CRT raster scan display 14, under control of microprocessor 48, to draw a simulated analog meter. With the present invention, microprocessor 48 generates both the scale of the meter and the pointer which moves as a function of the particular input signal received from the engine analyzer module 52.

FIG. 3 shows display screen 14A of CRT display 14 in which microprocessor 48 has generated a simulated analog tachometer display. When this display mode is selected by the operator through user interface 16, microprocessor 48 draws outline 300 of the simulated meter, scale 302 (which includes a horizontal line, vertical graduation lines, and numerical values adjacent the graduation line), pointer 304, base line 306, and block 308 containing a digital display of engine rpm, and message 310. In the embodiment shown in FIG. 3, pointer 304 has a fixed end point 304A and a movable end point 304B. Movable end point 304B is positioned along scale 302 at a point corresponding to the digital value of engine rpm. This engine rpm value indicated by movable end pont 304B of pointer 304 corresponds to the digital rpm value displayed in block 308. Microprocessor 48 also calculates intermediate points between end points 304 and 304B, and fills in the dots (in a manner similar to that described above with reference to simulated waveforms) to provide an essentially straight line pointer 304 between ends point 304A and 304B. The engine rpm value used by microprocessor 48 in generating the simulated tachometer is derived from the signals produced by No. 1 probe 24. By appropriate timing circuitry (not shown) within engine analyzer module 52, the engine rpm is derived in the form of a digital value which is provided to microprocessor 48 on a continual basis.

Microprocessor 48 updates CRT display 14 at a rate which is high enough so that pointer 304 appears to move as the measured input signal (in this case engine rpm) varies. As a result, the movement of pointer 304 simulates the movement of a pointer of an analog panel tachometer.

Microprocessor 48 generates pointer 304 by computing end point 304B on scale 302 based upon the input rpm value. Since end point 304A is fixed, and is effectively the pivot point of pointer 304, microprocessor 48 has the information necessary to compute the intermediate points between points 304A and 304B. Microprocessor 48 supplies the signals to display memory 60 which updates the position of pointer 304.

As the new position of pointer 304 is drawn, microprocessor 48 also causes display 14 to erase the previous position of pointer 304. This requires that display memory 60 store both the new pointer position and the previous pointer position so that the new pointer is drawn as the old pointer is being erased. This avoids a flickering effect each time the pointer position is updated.

As illustrated in FIG. 3, message 310 is preferably an alphanumeric message which is based upon digital data from engine analyzer module 52 or input data from user interface 16. In the particular example shown, message 310 states "IGNITION TIMING+8.0 DEGREES".

The system of the present invention, which utilizes the point addressable CRT display 14 to display a simulated meter, has several important advantages over prior art engine analyzers which use dedicated analog panel meters. First, the accuracy of the simulated meter is very high, since there are no moving parts. Second, the simulated analog meter function is very low in cost, since it utilizes components of the analyzer system which are used for other purposes, such as display 14, display memory 60, and microprocessor 48. Third, the present invention is very versatile, since any one of a variety of different meters can be simulated on the same display screen 14, simply by changing the scale and legend being displayed, and controlling the pointer as a function of a different input signal. Fourth, the size of the simulated analog meter can be much larger than conventional panel meters used in engine analyzers. As shown in FIG. 3, the meter fills almost the entire screen 14A of display 14. This allows the meter to be read from a much greater distance.

Another important advantage of the present invention is illustrated in FIG. 4. In this figure, a simulated meter similar to that shown in FIG. 3 is shown, and similar elements are designated by similar numerals. In FIG. 4, however, a different scale 302' is used, since a higher rpm value is being sensed and displayed. In FIG. 3, scale 302 ranges from 0 to 1,000 rpm, while in FIG. 4 scale 302' ranges from 0 to 3,000 rpm. In preferred embodiments of the present invention, microprocessor 48 automatically switches the scale of the simulated meter as a function of the input signal. As the digital input signal (for example rpm) approaches the upper end of the scale, microprocessor 48 automatically redraws the scale with a larger range. Similarly, when the input signal drops to a predetermined level, microprocessor 48 shifts range and redraws the scale automatically to reflect a lower range, so that a maximum resolution of the meter is maintained. This automatic changing of scales is performed without requiring operator intervention, as is required with prior art analog panel meters. In addition, since only a single scale is displayed at any one time, the operator does not have problems in interpreting the meter and selecting which scale should be used.

FIGS. 5A and 5B illustrate another preferred embodiment of the present invention. In this embodiment, the meter displayed on display screen 14A includes a shaded area 312, which represents a window within which the pointer 304 should remain while a test is being performed.

As illustrated in FIG. 5A, pointer 304 is outside of the desired window 312. In FIG. 5B, pointer 304 is within window 312. Pointer 304 is written by microprocessor 48 independently of window 312. This requires the capability of CRT display 14 being able to write in two "planes" which are independent of one another. In other words, the window 312 is drawn in an "A Plane" while pointer 304 is written in a "B Plane". These two planes are displayed essentially simultaneously, but the movement of the pointer 304 to various positions is independent of the position of window 312. Under the control of microprocessor 48, the A and B planes are effectively overlayed on display screen 14A. Pointer 304 does not interfere with window 312, since they are stored in different areas of display memory 60. Window 312 is drawn first, before pointer 304. Microprocessor 48 calculates end points on scale 302' based upon the desired window range. This window range may be stored in memory, or may be provided by the operator through user interface 16. By using the two end points of window 312 on scale 302' and end point 304A (which is the pivot point of pointer 304), microprocessor 48 draws in the lines between point 304A and end points 312A and 312B. Microprocessor 48 then uses a filler routine to fill in the area between the two lines in a "half tone" fashion to give a shaded background appearance. Finally, microprocessor 48 draws pointer 304 in the manner previously described in reference to FIGS. 3 and 4. Pointer 304 is updated at a rate which gives an apparent movement of the pointer as a function of the input signal, as if the window did not exist.

The embodiment illustrated in FIGS. 5A and 5B further illustrate the great versatility of the present invention. The position and size of window 312 is adjustable, and can be varied by the operator or varied automatically. The particular position and size of window 312 can be varied from meter-to-meter and from test-to-test without requiring a large number of individual costly analog panel meters.

FIG. 6 illustrates still another advantage of the present invention. Although the previous embodiments have shown a single meter being displayed on display screen 14, the present invention also permits the display of multiple meters simultaneously, so the operator can monitor several parameters at one time. In the embodiment shown in FIG. 6, three individual simulated meters 320, 330 and 340 are displayed on display screen 14A.

Although the specific examples shown in the figures involve a simulated tachometer, other functions performed by engine analyzer 10 also are well adapted to simulated analog meter displays. For example, meters 320, 330 and 340 are in one embodiment, voltmeters or ammeters showing voltage or current at different measured points of the electrical system of the engine under test. In another embodiment, the outputs of exhaust analyzer module 62 also are capable of being displayed by meters 320, 330 and 340. In each case, the operation of CRT display 14 under the control of microprocessor 48 is similar to that described with reference to the tachometer shown in FIGS. 3, 4, 5A and 5B.

In conclusion, the present invention is a highly advantageous digitally based engine analyzer apparatus which eliminates the need for dedicated analog panel meters, while still providing the operator with the useful information normally provided by analog meters. The present invention provides simulated analog meters on a point addressable display, and provides a variety of different display modes which are either impossible or difficult to achieve with conventional analog meters.

Although the present invention has been described with reference to preferred embodiments, workers skilled in the art will recognize that changes may be made in form and detail without departing from the spirit and scope of the invention.

What is claimed is:

1. An engine analyzer for testing systems and components of an internal combustion engine under test conditions, the engine analyzer comprising:
   means for supplying a variable input electrical signal derived from the system of component of the internal combustion engine under a test condition;
   means for periodically converting the input electrical signal to a digital signal;
   point addressable cathode ray tube (CRT) display means for displaying visual information based upon control signals; and
   digital control means for supplying the control signals to the CRT display means to cause the CRT display means to display a simulated analog meter including a visual depiction of a scale and a visual depiction of a pointer, the pointer having a position with respect to the scale which is controlled and updated periodically by the digital control means as a function of the digital signal to provide a simulated analog representation of variation of the variable input electrical signal.

2. The engine analyzer of claim 1 wherein the digital control means periodically provides control signals to the CRT display means representative of a first variable end point of the pointer as a function of the digital signal, a second fixed end point, and intermediate points between the first and second end points.

3. The engine analyzer of claim 1 wherein the control signals from the digital control means include digital data representative of individual points of the point addressable CRT display means, and wherein the point addressable CRT display means comprises:
   display memory means for periodically storing the digital data from the digital control means; and
   a point of addressable CRT display for displaying visual information based upon the stored digital data.

4. The engine analyzer of claim 3 wherein the display memory means periodically stores digital data representative of the visual information being displayed and digital data representative of visual information to replace the visual information being displayed.

5. The engine analyzer of claim 4 wherein the digital control means periodically provides control signals which cause the point addressable CRT display to erase the visual information based upon the first set of digital data while writing the visual information based upon the second set of digital data.

6. The engine analyzer of claim 1 wherein the digital control means selects one of a plurality of scales based upon a magnitude of the digital signal and supplies control signals which cause the visual depiction of the selected scale to be produced by the CRT display means.

7. The engine analyzer of claim 1 wherein the digital control means further periodically supplies control signals to the point addressable CRT display means to cause the point addressable CRT display means to display an alphanumeric message which includes a numerical representation of a magnitude of the digital signal in addition to the visual depiction of the scale and the visual depiction of the pointer.

8. The engine analyzer of claim 1 wherein the digital control means further supplies control signals to the point addressable display CRT means to cause the point addressable CRT display means to display a shaded area representative of a range withinn which the pointer should be maintained in order to maintain the test condition.

9. The engine analyzer of claim 8 wherein the shaded area and the cursor are displayed by the point addressable CRT display means independent of one another so that the pointer can move within and outside of the shaded area as a function of the digital signal.

10. An engine analyzer for testing systems and components of an internal combustion engine under test conditions, the engine analyzer comprising:
means for supplying a variable input electrical signal derived from the system or component of the internal combustion engine under a test condition;
means for periodically converting the input electrical signal to a digital signal;
display memory means for storing digital data representative of individual image points;
a point addressable display for displaying visual information based upon the stored digital data; and
digital control means for periodically supplying the digital data to the display memory means to cause the point addressable display to display a simulated analog meter including a visual depiction of a scale and a visual depiction of a pointer, the pointer having a position with respect to the scale which is controlled and updated periodically by the digital control means by means of the digital data as a function of the digital signal to provide a simulated analog representation of variation of the variable input electrical signal.

11. The engine analyzer of claim 10 wherein the digital data includes a first variable end point of the pointer which is a function of the digital signal, a second fixed end point, and intermediate points between the first and second end points.

12. The engine analyzer of claim 10 wherein the display memory means periodically stores digital data representative of the visual information being displayed and digital data representative of visual information to replace the visual information being displayed.

13. The engine analyzer of claim 12 wherein the digital control means periodically provides control signals which cause the point addressable display to erase the visual information based upon the first set of digital data while writing the visual information based upon the second set of digital data.

14. The engine analyzer of claim 10 wherein the digital control means selects one of a plurality of scales based upon a magnitude of the digital signal and supplies digital data which cause the visual depiction of the selected scale to be produced.

15. The engine analyzer of claim 10 wherein the digital data from the digital control means further includes points which cause the point addressable display means to display an alphanumeric message which includes a numerical representation of a magnitude of the digital signal.

16. The engine analyzer of claim 10 wherein the digital data from the digital control means further includes points which cause the point addressable display means to display a shaded area representative of a range within which the pointer should be maintained in order to maintain the test condition.

17. The engine analyzer of claim 16 wherein the shaded area and the pointer are displayed by the point addressable display independent of one another so that the pointer can move within the outside of the shaded area as a function of the digital signal.

18. An engine analyzer for testing systems and components of an internal combustion engine under test conditions, the engine analyzer comprising:
means for supplying a variable input electrical signal derived from the system or component of the internal combustion engine under a test condition;
means for periodically converting the input electrical signal to a digital signal;
point addressable display means for displaying visual information based upon control signals; and
digital control means for supplying the control signals to the point addressable display means to cause the point addressable display means to display a simulated analog meter including a visual depiction of a scale and a visual depiction of a pointer, and a shaded area representative of a range within which the pointer should be maintained in order to maintain the test condition, the pointer having a position with respect to the scale which is controlled and updated periodically by the digital control means as a function of the digital signal to provide a simulated analog representation of variation of the variable input electrical signal.

19. The engine analyzer of claim 18 wherein the shaded area and the pointer are displayed by the point addressable display means independent of one another so that the pointer can move within and outside of the shaded area as a function of the digital signal.

20. The engine analyzer of claim 18 wherein the digital control means periodically provides control signals to the point addressable display means representative of a first variable end point of the pointer as a function of the digital signal, a second fixed end point, and intermediate points between the first and second end points.

21. The engine analyzer of claim 18 wherein the control signals from the digital control means include digital data representative of individual points of the point addressable display means, and wherein the point addressable display means comprises:
- display memory means for periodically storing the digital data from the digital control means; and
- a point addressable display for displaying visual information based upon the stored digital data.

22. The engine analyzer of claim 21 wherein the display memory means periodically stores digital data representative of the visual information being displayed and digital data representative of visual information to replace the visual information being displayed.

23. The engine analyzer of claim 22 wherein the digital control means periodically provides control signals which cause the point addressable display to erase the visual information based upon the first set of digital data while writing the visual information based upon the second set of digital data.

24. An engine analyzer for testing systems and components of an internal combustion engine under test conditions, the engine analyzer comprising:
- means for supplying a variable input electrical signal derived from the system or component of the internal combustion engine under a test condition;
- means for periodically converting the input electrical signal to a digital signal;
- point addressable display means for displaying visual information based upon control signals; and
- digital control means for supplying the control signals to the point addressable display means to cause the point addressable display means to display a simulated analog meter including a visual depiction of a selected scale of a plurality of scales and a visual depiction of a pointer, the pointer having a position with respect to the selected scale which is controlled and updated periodically by the digital control means as a function of the digital signal to provide a simulated analog representation of variation of the variable input electrical signal, the digital control means selecting the selected scale based upon a magnitude of the digital signal.

25. An engine analyzer for testing systems and components of an internal combustion engine under test conditions, the engine analyzer comprising:
- means for supplying a variable input electrical signal derived from the system or component of the internal combustion engine under a test condition;
- means for periodically converting the input electrical signal to a digital signal;
- point addressable display means for displaying visual information based upon control signals; and
- digital control means for supplying the control signals to the point addressable display means to cause the point addressable display means to display a simulated analog meter including a visual depiction of a scale, a visual depiction of a pointer and a message, the pointer having a position with respect to the scale which is controlled and updated periodically by the digital control means as a function of the digital signal to provide a simulated analog representation of variation of the variable input electrical signal, wherein the message is a function of the digital signal and includes a numerical value which corresponds to a reading being displayed by the simulated analog meter.

* * * * *